(12) United States Patent
Saxena et al.

(10) Patent No.: US 9,348,539 B1
(45) Date of Patent: May 24, 2016

(54) MEMORY CENTRIC COMPUTING

(71) Applicant: INPHI CORPORATION, Santa Clara, CA (US)

(72) Inventors: Nirmal Raj Saxena, Westlake Village, CA (US); David Wang, Westlake Village, CA (US); Christopher Haywood, Santa Clara, CA (US); Eric McDonald, Santa Clara, CA (US); Chao Xu, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 202 days.

(21) Appl. No.: 14/194,416

(22) Filed: Feb. 28, 2014

Related U.S. Application Data

(63) Continuation-in-part of application No. 13/797,708, filed on Mar. 12, 2013, now abandoned.

(60) Provisional application No. 61/779,695, filed on Mar. 13, 2013.

(51) Int. Cl.
  *G06F 3/06* (2006.01)

(52) U.S. Cl.
  CPC ............ *G06F 3/0685* (2013.01); *G06F 3/0619* (2013.01); *G06F 3/0655* (2013.01)

(58) Field of Classification Search
  CPC .... G06F 3/0685; G06F 3/0655; G06F 3/0619
  See application file for complete search history.

(56) References Cited

U.S. PATENT DOCUMENTS

| | | | | |
|---|---|---|---|---|
| 5,799,200 A * | 8/1998 | Brant | ................... | G06F 11/1441 365/229 |
| 2008/0222491 A1* | 9/2008 | Lee | ..................... | G06F 11/1068 714/763 |
| 2011/0066790 A1* | 3/2011 | Mogul | .................. | G06F 12/023 711/103 |
| 2011/0161597 A1* | 6/2011 | Tremaine | ............ | G06F 12/0895 711/133 |
| 2013/0111123 A1* | 5/2013 | Thayer | .................... | G06F 13/16 711/105 |
| 2013/0297987 A1* | 11/2013 | Gupta | ................. | G06F 11/1064 714/773 |
| 2014/0176234 A1* | 6/2014 | King | ................... | H04L 25/0286 327/565 |

OTHER PUBLICATIONS

Jim Hutchby et al., "Assessment of the Potential & Maturity of Selected Emerging Research Memory Technologies Workshop & ERD/ERM Working Group Meeting", ITRS Emerging Research Devices Final Report, Jul. 23, 2010, http://www.itrs.net/Links/2010ITRS/2010Update/ToPost/ERD_ERM_2010FINALReportMemoryAssessment_ITRS.pdf.
Dong Li et al., "Identifying Opportunities for Byte-Addressable Non-Volatile Memory in Extreme-Scale Scientific Applications", 26th IEEE International Parallel & Distributed Processing Symposium, 2012, Shanghai, China.
David Patterson et al., "A Case for Intelligent DRAM: IRAM", IEEE Micro, Apr. 1997, pp. 1-23.

(Continued)

*Primary Examiner* — Edward Dudek, Jr.
(74) *Attorney, Agent, or Firm* — Richard T. Ogawa; Ogawa P.C.

(57) ABSTRACT

A hybrid memory system. This system can include a processor coupled to a hybrid memory buffer (HMB) that is coupled to a plurality of DRAM and a plurality of Flash memory modules. The HMB module can include a Memory Storage Controller (MSC) module and a Near-Memory-Processing (NMP) module coupled by a SerDes (Serializer/Deserializer) interface. This system can utilize a hybrid (mixed-memory type) memory system architecture suitable for supporting low-latency DRAM devices and low-cost NAND flash devices within the same memory sub-system for an industry-standard computer system.

16 Claims, 12 Drawing Sheets

(56) References Cited

OTHER PUBLICATIONS

M. Harwood et al., "A 225mW 28Gb/s SerDes in 40nm CMOS with 13dB of analog equalization for 100GBASE-LR4 and optical transport lane 4.4 applications", IEEE International Solid States Circuits Conference (ISSCC), San Francisco, 2012.

Inphi, Enabling Cloud Computing and Server Virtualization with Improved Power Efficiency, Inphi iMB Technology White Paper, Sep. 7, 2010, pp. 1-8, www.inphi.com/products/whitepapers/iMB-White-Paper.pdf.

John Carter et al., "Impulse: Building a Smarter Memory Controller," High Performance Computer Architecture, 1999.

* cited by examiner

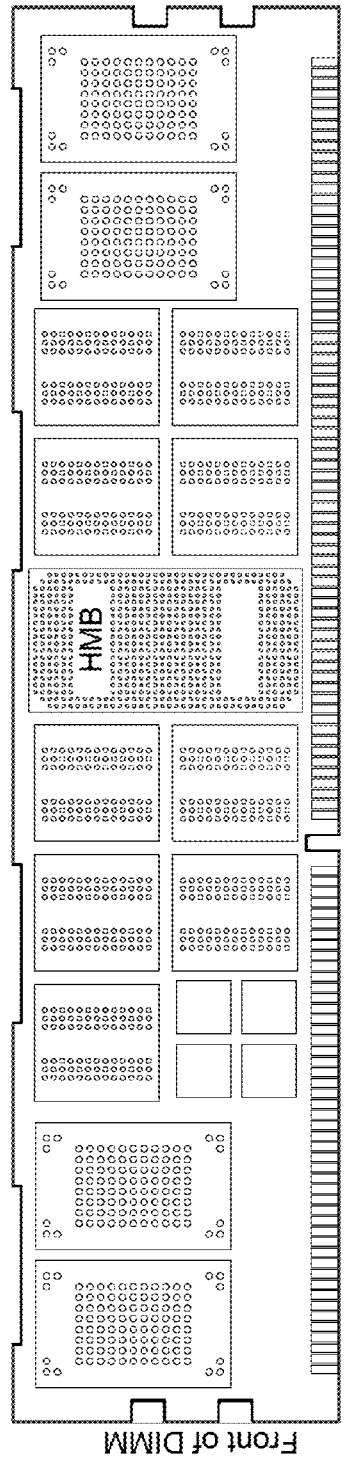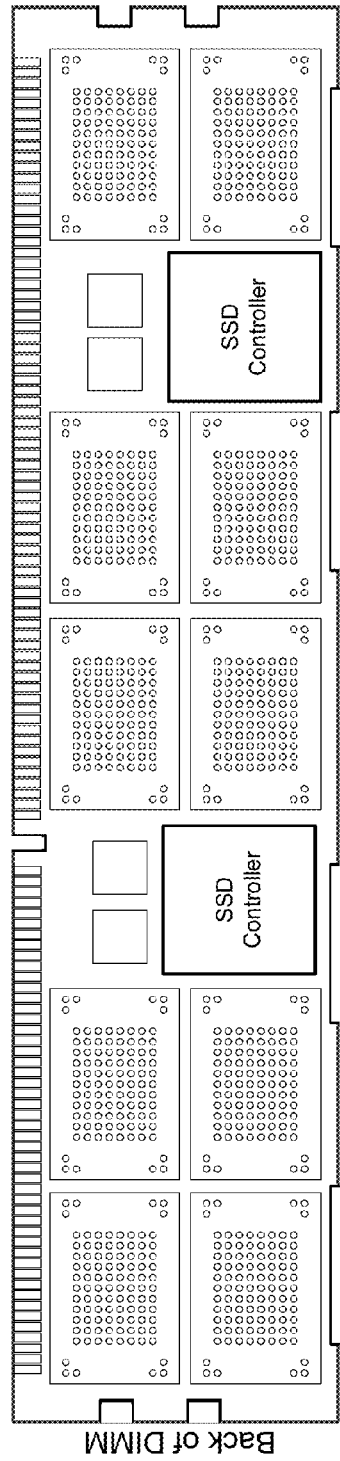

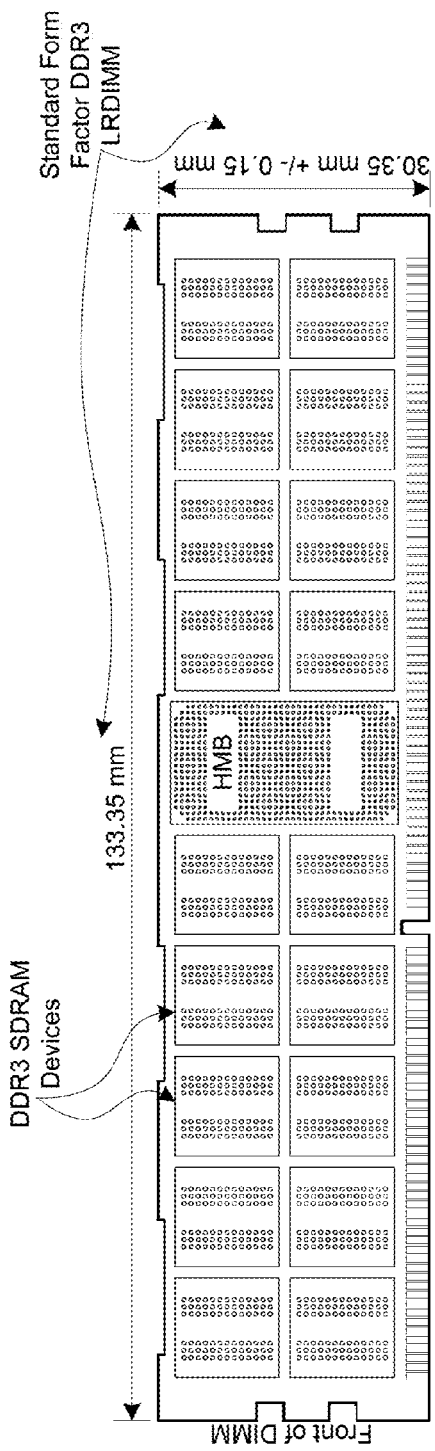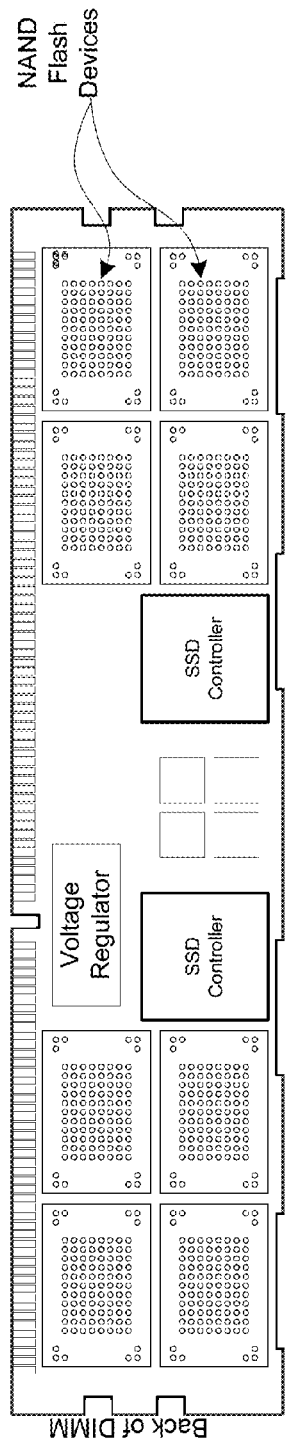
FIG. 10A
FIG. 10B

MEMORY CENTRIC COMPUTING

CROSS-REFERENCE TO RELATED APPLICATIONS

The present application claims priority to and incorporates by reference, for all purposes, the following patent application: U.S. Provisional App. 61/779,695, filed Mar. 13, 2013. The present application is a continuation-in-part application of U.S. patent application Ser. No. 13/797,708, titled "MEMORY CENTRIC COMPUTING" by David Wang et al., filed Mar. 12, 2013. The present application also incorporates by reference, for all purposes, the following pending patent applications: U.S. patent application Ser. No. 12/267,355, and U.S. patent application Ser. No. 12/563,308.

BACKGROUND OF THE INVENTION

The present invention relates generally to memory systems, and more particularly to computer systems which include memories systems with auxiliary interfaces. These systems can be applied to communication networks, data infrastructures, and the like.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing computing and data communication systems need to be improved to address these needs.

Traditional computer systems, such as servers, workstations, desktops and laptops, all use pluggable memory, which can be inserted into slots on the computer's motherboard as needed. The most common form of pluggable memory is the Dual In-line Memory Module (DIMM). Historically, DIMMs contain multiple RAM chips—typically DRAM—each of which has a data bus width of 4 or 8 bits. Typically, eight or nine 8-bit DRAM chips (or twice as many 4-bit DRAM chips) are arranged in parallel to provide each DIMM with a total data bus width of 64 or 72 bits; the data bus, typically referred to as the 'DQ' bus, is connected to a host controller. Each arrangement of 64 or 72 data bits using DRAM chips in parallel is termed a 'rank'.

A command/address (CA) bus also runs between the host controller and each DIMM; the CA and DQ busses together form a 'system' bus. With a basic unbuffered DIMM, the CA bus is connected to every DRAM on the DIMM. As a result, there is a high electrical load on the CA bus, given by the product of the number of DRAMs times the number of ranks. For the DQ bus, the number of electrical loads is equal to the number of ranks.

There have been many types of computing systems and methods. Unfortunately, they have been inadequate for various existing applications. Therefore, improved computing/communication systems and methods are desired.

BRIEF SUMMARY OF THE INVENTION

According to the present invention, techniques are directed to computing systems and methods. The present invention is directed to memory systems which include a memory buffer having one or more auxiliary interfaces. In various embodiments, the auxiliary interfaces enable memory systems to send and receive data to and from other memory systems having such auxiliary interfaces and using a defined data protocol. Additionally, various embodiments enable separate computer systems having such memory systems to send and receive data to and from other memory systems having such auxiliary interfaces.

In an embodiment, the present invention provides a hybrid memory system. This system can include a processor coupled to a hybrid memory buffer (HMB) that is coupled to a plurality of DRAM and a plurality of Flash memory modules. The HMB module can include a Memory Storage Controller (MSC) module and a Near-Memory-Processing (NMP) module coupled by a SerDes (Serializer/Deserializer) interface. This system can utilize a hybrid (mixed-memory type) memory system architecture suitable for supporting low-latency DRAM devices and low-cost NAND flash devices within the same memory sub-system for an industry-standard computer system.

In an embodiment, a buffering device is employed to reduce loading in a 'load reduction' DIMM (LR-DIMM). An LR-DIMM containing multiple DRAM chips uses a logic device to buffer the DQ and CA signals between the DRAMs and a host controller. Logic device may be, for example, a single device such as the iMB (isolating Memory Buffer). Memory systems of this sort are described, for example, in co-pending U.S. patent application Ser. Nos. 12/267,355 and 12/563,308, which are incorporated herein by reference, for all purposes.

Many benefits are recognized through various embodiments of the present invention. Such benefits include having a computer system not only with DRAM buffering and signaling capabilities, but also having an architectural infrastructure to access and control high density NAND flash devices. Another benefit of this hardware architecture is that it does not require any changes to the existing CPU memory controllers. Other benefits will be recognized by those of ordinary skill in the art that the mechanisms described can be applied to other communications systems as well.

The present invention achieves these benefits and others in the context of known memory technology. These and other features, aspects, and advantages of the present invention will become better understood with reference to the following description, figures, and claims.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

FIGS. 1A and 1B show a front and back view, respectively, of a simplified architecture of a hybrid memory module according to an embodiment of the present invention.

FIGS. 10A and 10B illustrate an exemplary implementation of the hybrid memory module, and other implementations are possible, subject to the constraints of the DIMM form factor, the size of the DRAM devices, the NAND devices, the SSD controller chips, as well as the footprint of the voltage regulation devices.

DETAILED DESCRIPTION OF THE INVENTION

Figure 2:
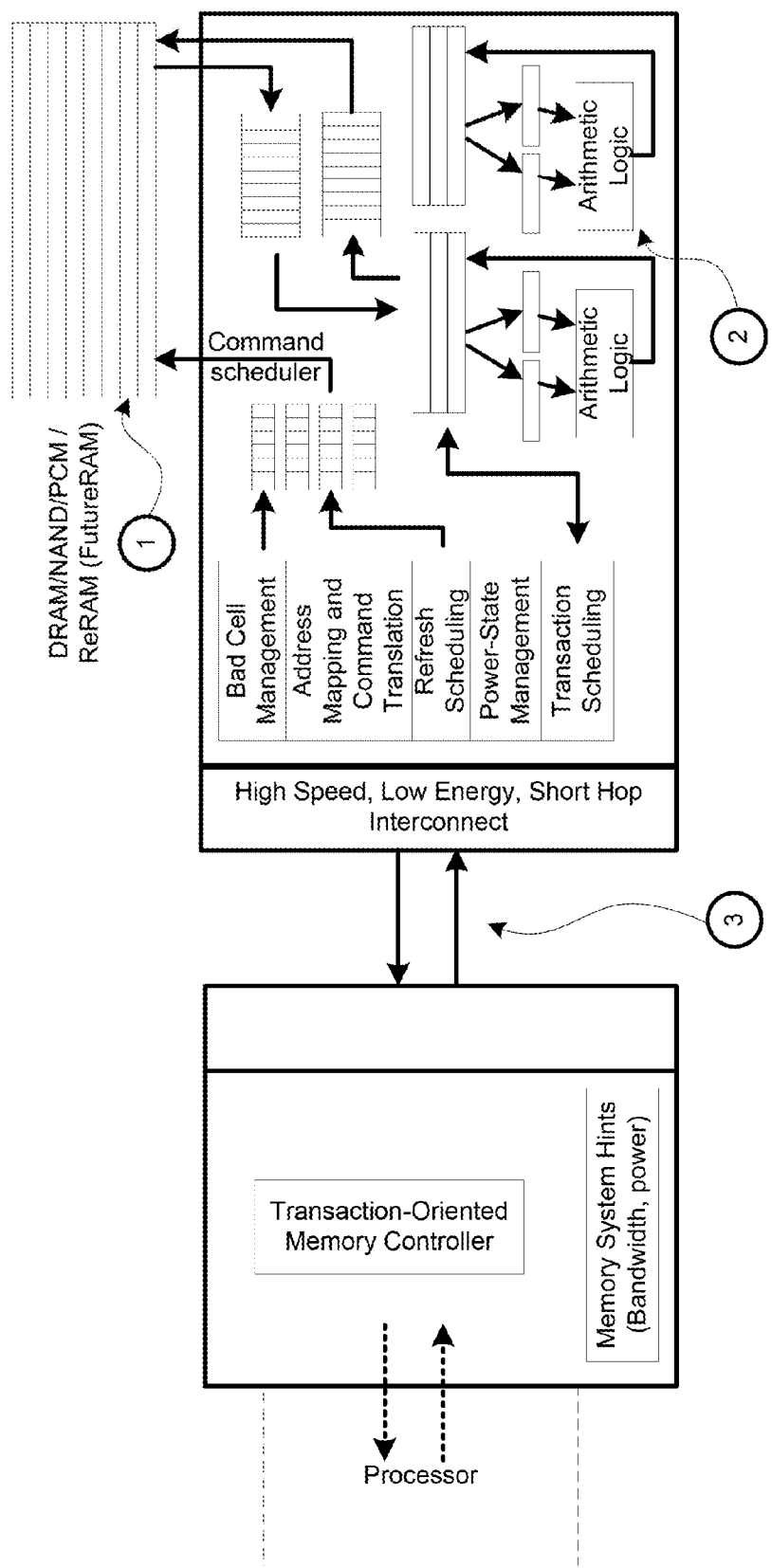
FIG. 2 illustrates the vision of a memory system that contains three technologies desirable to the creation of a suitable-for-exascale-class-systems memory system.

According to the present invention, techniques are directed to computing systems and methods. Additionally, various embodiments enable separate computer systems having such memory systems to send and receive data to and from other memory systems having such auxiliary interfaces.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

According to an embodiment, the present invention is a hardware architecture of a DIMM (dual insertion memory module) chipset that interfaces with the memory controller interface (called DIMM interface) of a central processing unit (CPU). One instance of this architecture applies to CPUs based on Intel x86 processors. Traditional DIMM chipsets provide only buffering and signaling interface between DRAM (dynamic random access memory) devices and the DIMM interfaces. In this invention, the hardware architecture of the chipset provides the DIMM interface not only the DRAM buffering and signaling capability, but also an architectural infrastructure to access and control high density NAND flash devices. Another important aspect of this hardware architecture is that it does not require any changes to the existing CPU memory controllers. To distinguish this architectural approach from the traditional approach we call our chipsets the Hybrid DIMM chipsets.

In an example, the present invention provides a hybrid (mixed-memory type) memory system architecture suitable for supporting low-latency DRAM devices and low-cost NAND flash devices within the same memory sub-system for an industry-standard computer system. One example implementation of the hybrid memory system architecture is shown as a standards-compatible hybrid memory module illustrated in FIGS. 1A and 1B.

FIGS. 1A and 1B illustrate a front view and back view, respectively, of a simplified architecture of a hybrid memory module according to an embodiment of the present invention. As shown, the front of the DIMM in FIG. 1A shows an HMB (Hybrid Memory Buffer) module, a plurality of DRAM modules (rectangles with two sets of circles arrays each configured with three columns), and a plurality of NAND flash modules (rectangles with a center array and three-circle corner groupings). On the back of the DIMM in FIG. 1B, the memory system includes a plurality of NAND flash memory modules and a couple of SSD controllers. In an example, the present invention provides a processing-near-memory memory system architecture suitable for implementation in an industry-standard computer system.

As an example, the present invention implements a JEDEC-standards-compatible buffering device that supports the hybrid memory system architecture as well as the processing-near-memory memory system architecture. In an example, the techniques include software, firmware, device driver, or kernel code, as desirable, to support the Hybrid-memory system and the processing-near-memory memory system on industry-standard computer systems. In an example, the techniques include an energy-optimized, high-speed SerDes (Serializer/Deserializer) technology, reducing the energy cost of data transport to below 5 pJ/bit.

In an embodiment, the techniques include an improved hybrid (mixed-memory type) memory system architecture.

The techniques include a buffering component that (1) utilizes the energy-optimized, high-speed SerDes technique; (2) implements the improved hybrid memory system architecture; and (3) implements the improved processing-near-memory memory system architecture. In an alternative example, the present techniques include a suitable-for-exascale-class-systems memory sub-system, in the form of a multi-memory-die stack such as the Hybrid Memory Cube (HMC), or in the form of a memory module that utilizes the buffering component. Additionally, the present techniques include software, firmware, device driver, or kernel code, as desired, to support the hybrid-memory system and the processing-near-memory memory system. In an example, the technique includes a suitable-for-exascale-class-systems memory sub-system.

In an embodiment, the architecture of a memory system enables the construction of exascale-class computing platforms. In an example, the memory systems provide the functionality of data storage and data retrieval. In general terms, there are multiple metrics that define the characteristic of a memory system: latency, bandwidth, power, capacity, cost (per bit), reliability, access granularity, persistence, and compatibility. Previous research had identified power as an overriding factor that limits the scalability of exascale-class compute platforms, and this is a desirable topic that should be achieved. The gap between existing capabilities and exascale-class platform requirements point to the need for revolutionary technologies to enable future memory systems that will meet exascale-class platform requirements while achieving aggressive power consumption targets.

Since conventional memory systems are highly complex systems that require long lead times to verify and validate in terms of compatibility and functionality. The long design and validation cycles in turn biases decision makers toward evolutionary approaches as opposed to revolutionary approaches to memory system architecture development. For example, main stream memory system technology gradually evolved from SDRAM to DDR SDRAM, then to DDR2 SDRAM, then to DDR3 SDRAM. Concurrently, Direct RDRAM and Fully Buffered DIMM suggest that revolutionary approaches in the memory system space tend to fail in favor of evolutionary approaches.

FIG. 2 illustrates the vision of a memory system that contains three technologies desirable to the creation of a suitable-for-exascale-class-systems memory system. The three technologies of the present memory system are:
1. Hybrid-memory memory system architecture, labeled as "1" in FIG. 2.
2. Processing-near-memory memory system architecture, labeled as "2" in FIG. 2.
3. High energy-efficiency, short-distance-oriented high-speed SerDes technology, labeled as "3" in FIG. 2.

These techniques are described throughout the present specification and more particularly below.

The advancement of Moore's Law has allowed semiconductor process scaling to enable smaller and faster transistors every year. However, standard transistor structures and existing memory storage cell structures have begun to reach the limits of process scaling, and various memory technologies such as SRAM, DRAM as well as NAND Flash devices are approaching limitations in scaling beyond the 16 nm generation. Additionally, as NAND Flash devices continue to hold significant cost advantages over DRAM devices, system architects and design engineers are actively seeking to extend the usage of NAND Flash for applications that can accept the characteristics of NAND Flash. In essence, the electronics industry is actively seeking alternatives that can replace or augment DRAM devices, and we summarize that desire as follows:
1. DRAM scaling is reaching an end, and the industry is actively searching for a replacement memory technology.
2. There is a large cost gap and large performance gap between DRAM and the next level of backing store, and system users are actively seeking to improve the cost/performance or power/performance characteristics of memory systems by using non-volatile memory devices such as NAND Flash devices.

To meet the desire of the search for alternatives that can replace or augment DRAM devices, we propose a flexible, extensible hybrid-memory system architecture with the following guiding principles:
1. It is necessary to develop a memory system architecture to support new memory devices as well as mixed memory types, and the architecture should be extensible to support new memory types that may emerge in the future.
2. It is necessary and desirable to support the use of NAND Flash devices for use in main memory.
3. It is necessary and desirable to support mixed-memory-type memory systems using existing system infrastructure.

From Berkeley's IRAM project to University of Notre Dame's Processor-in-Memory (PIM) project, the concept of integrating processing along with memory has long been examined by academia. The benefits of processing-in-memory are well known. Processing-in-memory provides for high degrees of parallelism, provides large memory bandwidth, minimizes memory-to-compute latency, and reduces energy costs of data transport. However, the challenges of processing-in-memory are also well known. For example, it is well known that logic transistors have poor performance on memory-optimized process technology, and memory storage cells such as eDRAM require relatively large cell sizes, and therefore inefficiently utilizes silicon real estate. Consequently, no ideal architectures or process technology currently exists to support processing-in-memory.

To advance the state-of the art of future memory system technology, and to overcome the known challenges of processing-in-memory, we provide a flexible, extensible processing-near-memory architecture by a processing-near-memory architecture in a standards-compatible memory buffering device and use it for processing-near-memory architectures. Specifically, we implement wide, parallel, arithmetic logic units in a standards-compatible memory buffering device, where the logic in the memory buffering device may be used to reduce the necessity of data movement in the memory system and effectively increase aggregate memory bandwidth. We will implement a set of wide, parallel vector registers in a standards-compatible memory buffering device, where data may be moved between the host memory controller, the DRAM devices as well as NAND memory devices, and operations such as page zeroing, ECC-parity generation, gather, and other vector arithmetic operations may be performed on the vector registers.

In an example, the energy cost to move data in a current DDR3 memory technology is stated to be approximately 5 nJ per double precision operand. Accounting for the command and protocol overhead of moving the double precision operand, the stated energy cost approximately equals 50 pJ per bit transfer. Further, the strongest terms possible that a reduction in the energy cost of the data movement is desirable.

In an embodiment, the present invention includes a 28 GT/s link in 40 nm CMOS process that consumes 225 mW which equates to 8 pJ/bit. This technology is designed to meet CEI-28G-VSR specification with 10 dB loss at half the data rate between transmitter and receiver package.

As shown in Table 1, this corresponds to traces between 4.5 to 7.5 inches on the line card and about 1" on the module which normally uses lower loss dielectric material.

TABLE 1

Loss budget for CEI-28G-VSR channel

| CEI-28G-VSR channel component | Dielectric Material | | | |
|---|---|---|---|---|
| | N4000-13 | N4000-13S1 | Megtron 6 | unit |
| Trace loss per inch @ 14 GHz | 1.5 | 1.2 | 0.9 | dB/inch |
| Connector loss @ 14 GHz | 1.2 | 1.2 | 1.2 | dB |
| Loss allocation for 2 sets of vias in the channel | 0.5 | 0.5 | 0.5 | dB |
| Max Module PCB loss Max reach on Line Card | 1.5 | 1.5 | 1.5 | dB |
| Trace length for total 10 dB loss Budget | 4.53 | 5.67 | 7.56 | inch |

Figure 3:
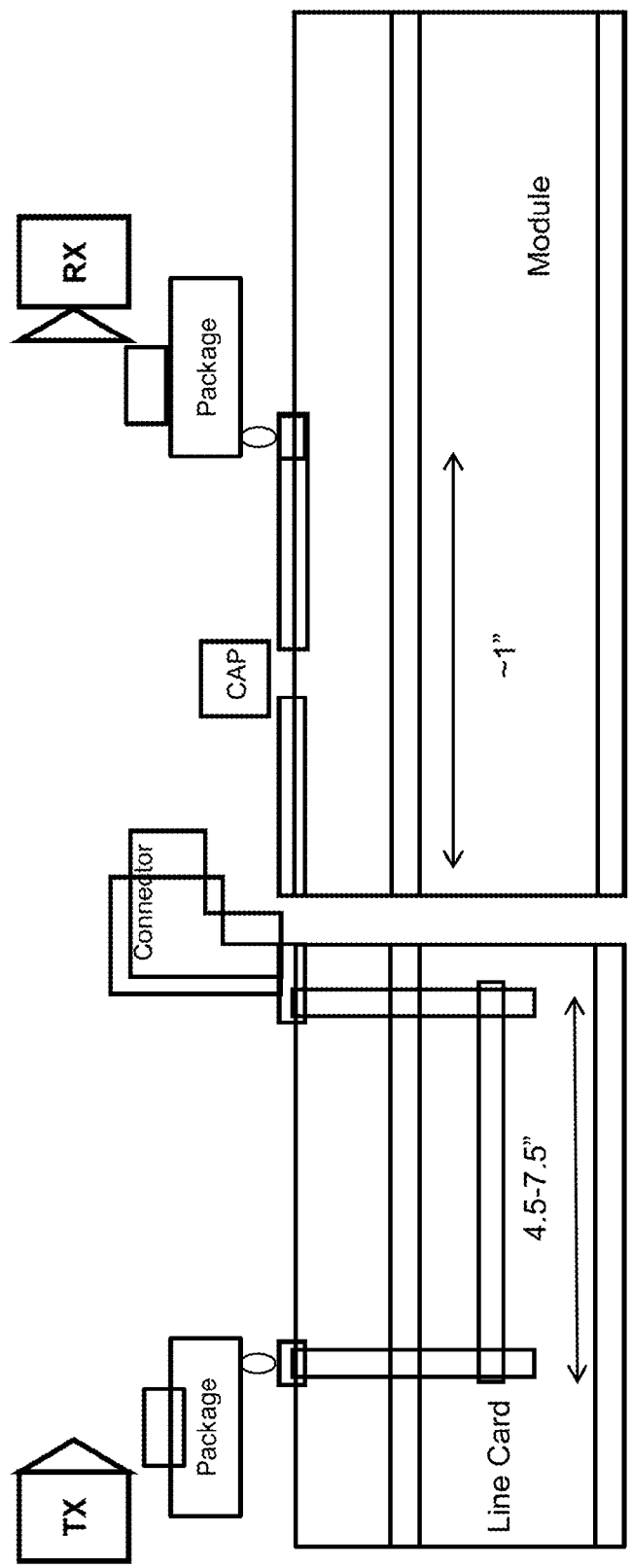
FIG. 3 is a simplified cross section of a memory channel according to an embodiment of the present invention.

The cross section of such channel is shown in FIG. 3. FIG. 3 is a simplified cross section of a memory channel according to an embodiment of the present invention. The channel includes traces on line Card as well as module, plus vias and high-speed connector with a budgeted total loss of 10 dB at half the data rate frequency. This loss does not include transmit and receive package losses.

Figure 4:
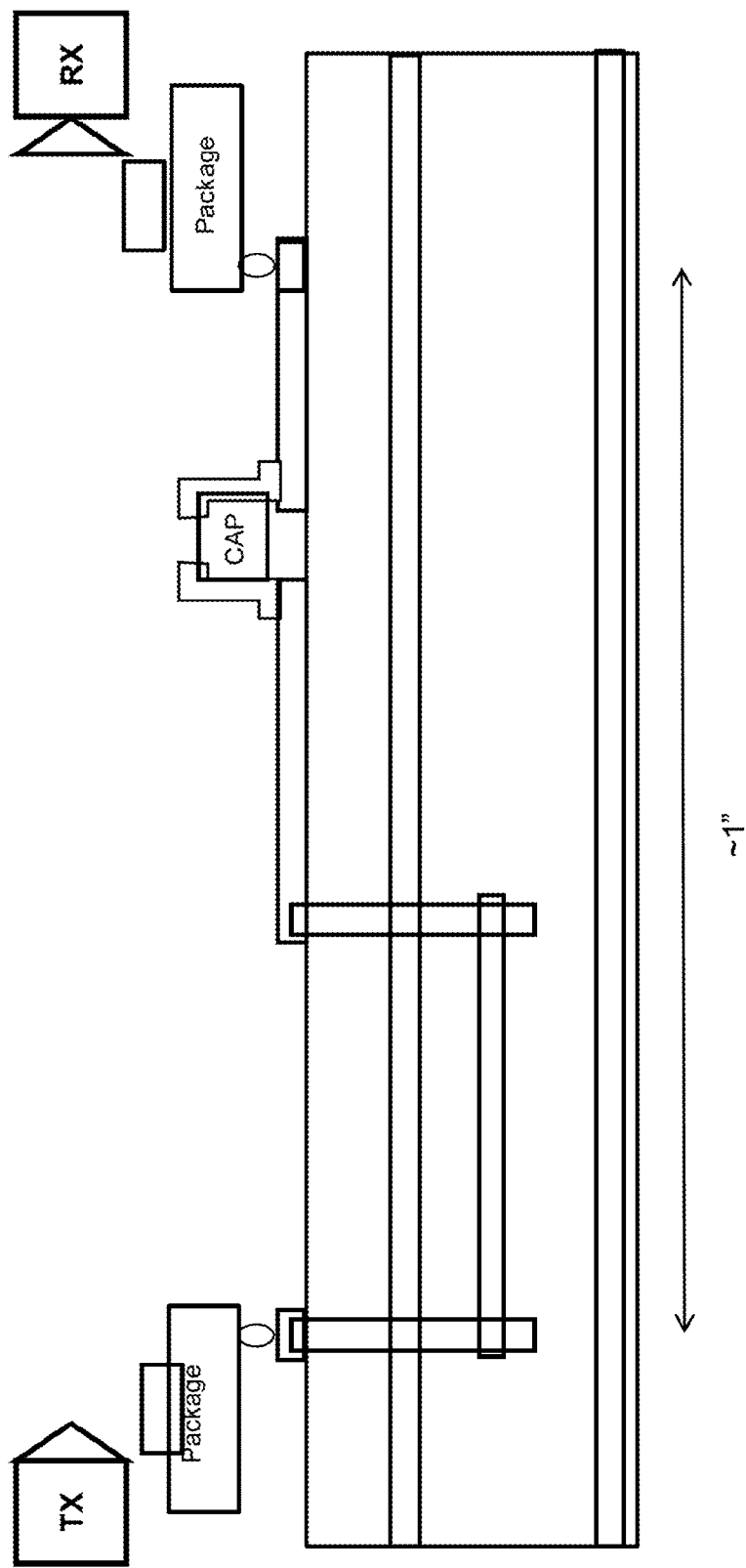
FIG. 4 shows a cross section of a memory channel according to an embodiment of the present invention.

FIG. 4 shows a cross section of a memory channel according to an embodiment of the present invention. As shown, FIG. 4 shows the anticipated cross section of the next generation memory channel. Considering the shorter channel lengths and no connector in the channel, the total loss of the channel will be substantially smaller.

As shown in Table 2 applying the same link budget analysis to the memory channel with total of 1" trace, the total channel loss will be less than 2.5 dB for improved FR4 materials which is substantially lower than the 10 dB loss budget for CEI-28G-VSR.

| Next generation Memory channel component | Dielectric Material | | | |
|---|---|---|---|---|
| | N4000-13 | N4000-13S1 | Megtron 6 | unit |
| loss of 1" trace @ 14 GHz | 1.5 | 1.2 | 0.9 | dB |
| Loss allocation for 2 sets of vias in the channel | 0.5 | 0.5 | 0.5 | dB |
| Loss allocation for an AC coupling cap | 0.5 | 0.5 | 0.5 | dB |
| total channel loss | 2.50 | 2.20 | 1.90 | dB |

In an example, 28 GT/s SerDes technology utilized in the present invention is provided to meet CEI-28G-VSR specifications with a very low power. Given the channel characteristics of the memory high speed SerDes interface is somewhat different from the 28 GT/s device from Inphi Corporation, the transmitter and receiver equalization as well as the clock and data recovery blocks will be re-architected to reduce the power consumption of the SerDes by a factor of two at 28 GT/s to approach 4.75 pJ/bit. This architected design will be implemented in 28 nm CMOS process (vs. 40 nm CMOS process for the existing Inphi's 28 GT/s SerDes). In an example, the iMB02 is a JEDEC-standard Memory Buffer adopted by JEDEC as an industry standard DDR3 memory buffering device. The iMB02 enables the JEDEC-standard Load-Reducing DIMM (LRDIMM).

Figure 5:
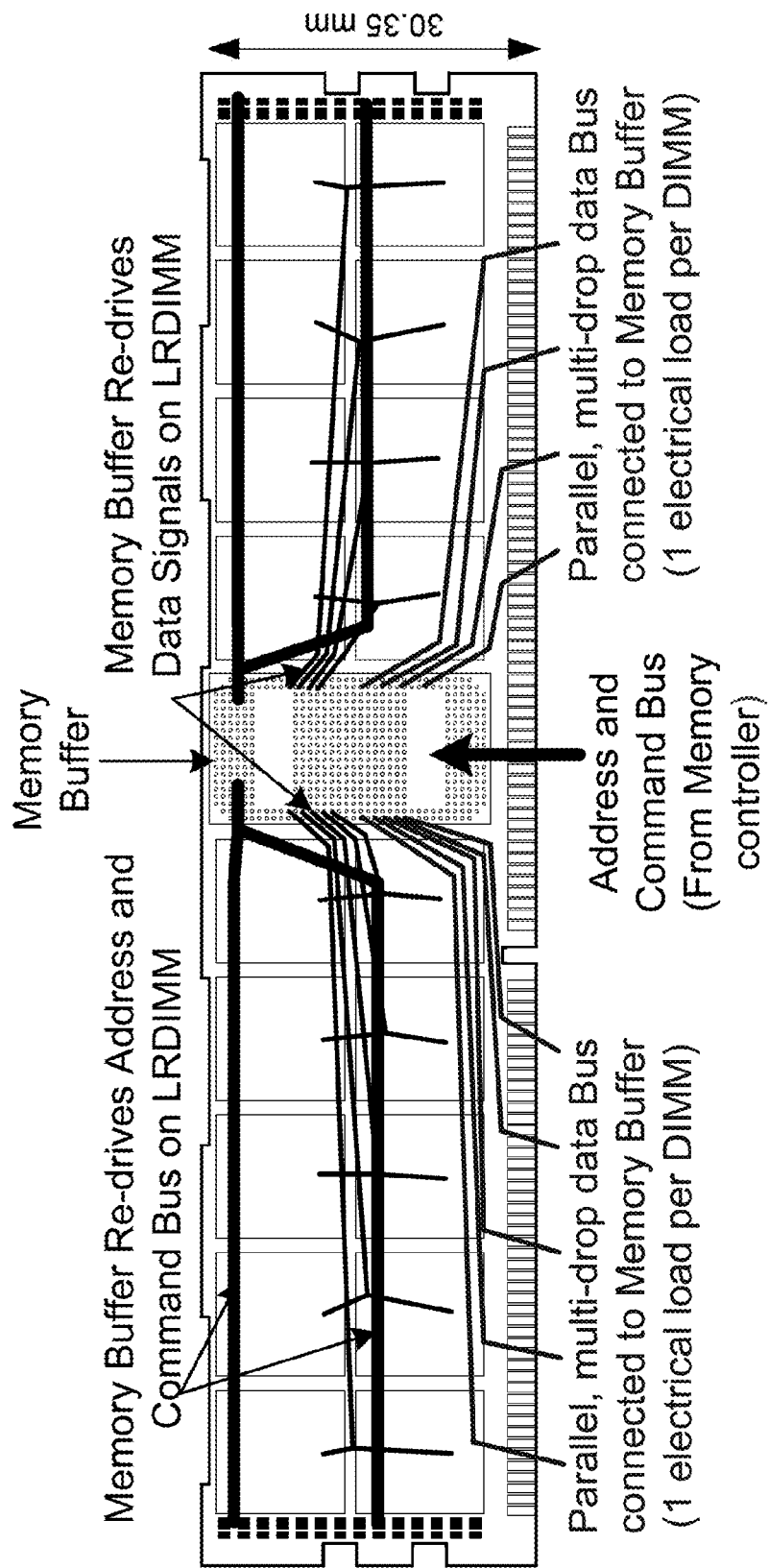
FIG. 5 illustrates the functionality of a Memory Buffer device in the context of an LRDIMM.

FIG. 5 illustrates the functionality of a Memory Buffer device in the context of an LRDIMM. FIG. 5 shows that the Memory Buffer electrically isolates the address, command and data busses of the DRAM devices from the address, command and data busses of the host memory controller. The isolation of the DRAM devices from the host controller is the fundamental basis that enables the movement of data between the host memory controller, DRAM devices on the memory module, and alternative memory technologies such as NAND Flash devices.

Figure 6:
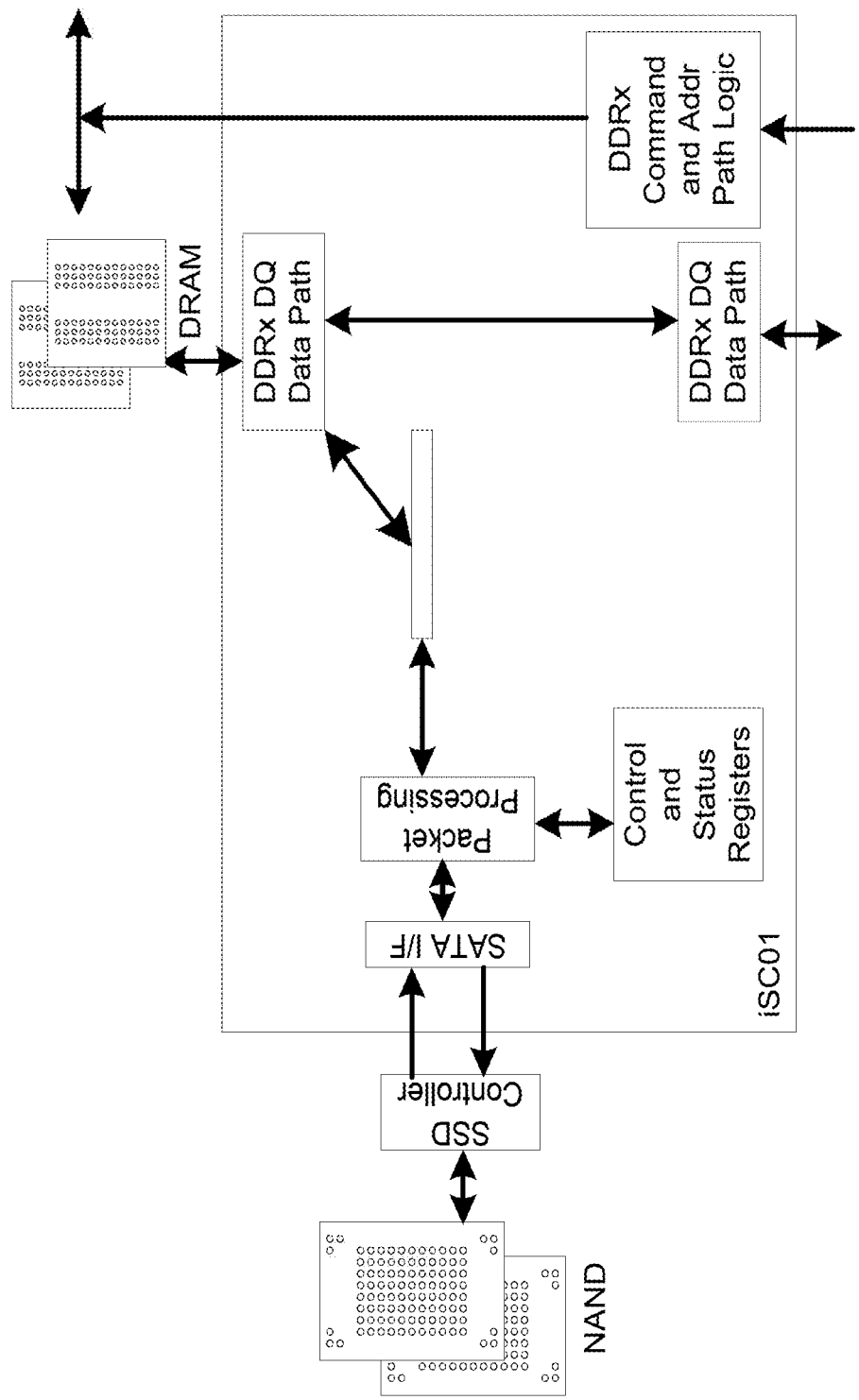
FIG. 6 shows the block-diagram view of the iSC01, where the iSC01 includes a data path that enables the movement of data from on-DIMM DRAM devices to NAND devices upon power fail, and from NAND devices to DRAM upon the initiation of controller-directed data restore operation.

In an embodiment, the iSC01, a Storage Controller, enables a standards-compatible, non-volatile LRDIMM. The primary functionality of iSC01 is to support power-fail backup functionality for non-volatile main-memory purposes. The iSC01 is an evolutionary product that is enabled with the use of the iMB02 design enhanced with a SATA interface that connects to an on-DIMM SSD controller that in turn controls on-DIMM NAND devices. FIG. 6 shows the block-diagram view of the iSC01, where the iSC01 includes a data path that enables the movement of data from on-DIMM DRAM devices to NAND devices upon power fail, and from NAND devices to DRAM upon the initiation of controller-directed data restore operation.

Figure 7:
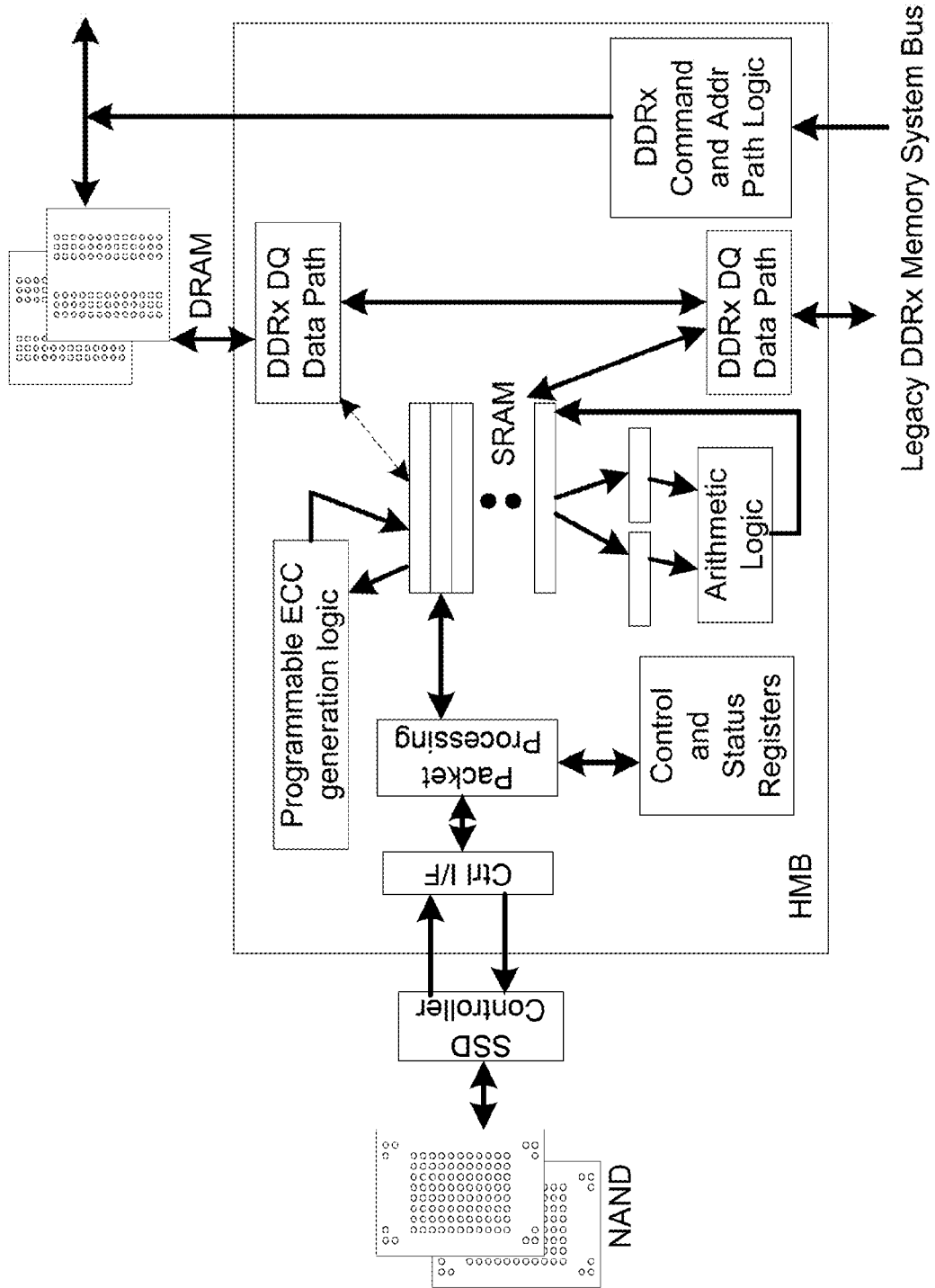
FIG. 7 illustrates that the block diagram view of the HMB is similar to the block diagram view of the iSC01 as illustrated in FIG. 6 according to an embodiment of the present invention.

In an example, the Hybrid Memory Buffer (HMB) is a JEDEC standards-compatible memory buffering device based on the iMB02 and the iSC01. The HMB will support hybrid memory and near-memory-processing. FIG. 7 illustrates that the block diagram view of the HMB is similar to the block diagram view of the iSC01 as illustrated in FIG. 6, but includes the following additions: more SRAM buffering to support an extensible model of data movement between NAND and DRAM devices, multi-KB vector registers, Arithmetic logic units to perform logic operations on the vector registers, programmable ECC generation logic, and an enhanced set of control and status registers to direct the flow of data between the various memories and between the SRAM buffers and vector registers. In the following sections, important features of the HMB are described.

In an example, the HMB is an enhanced-capability extension of a JEDEC standard DDR3 memory buffer, and it will enable the construction of a hybrid memory module that is functionally, electrically, and mechanically compatible with the DDR3 LRDIMM. In the case that support for the NAND sub-system is disabled, the HMB-enabled hybrid memory module with DDR3 DRAM devices simply behaves as a DDR3 LRDIMM. The HMB can also be configured to support DDR4 DRAM devices and enable a hybrid memory module with DDR4 DRAM and NAND devices.

In an embodiment, the present invention includes a hybrid memory system. This system can include a processor coupled to a hybrid memory buffer (HMB) that is coupled to a plurality of first memory modules and a plurality of second memory modules. The first memory modules can include RAM (Random Access Memory) modules, DRAM (Dynamic RAM) modules, or SDRAM (Synchronous DRAM), or the like. The second memory modules can include flash memory modules, NAND flash memory modules, vertical NAND flash memory modules, or NOR flash memory modules, or the like.

In an embodiment, the HMB module can include a Memory Storage Controller (MSC) module. This MSC module can include control and status registers, a packet processing module coupled to the control and status registers, and a control interface coupled to the packet processing module and to the plurality of second memory modules. The MSC module is configured to enable data movement from the plurality of first memory modules to the plurality of second memory modules upon power fail and vice versa upon initiation of a controller-directed data restore operation.

In an embodiment, the HMB module can include a Near-Memory-Processing (NMP) module. The NMP module can include an SRAM buffer coupled to the plurality of first memory modules and to the packet processing module, and a plurality of logic circuits coupled to the SRAM buffer, the logic circuits configured to move data between the plurality of first and second memory modules via the control and status registers. The SRAM buffer includes multiple pages, each of the pages being characterized by a 4 KB size; and wherein the SRAM buffer is spatially disposed in a centralized location and configured to enable near-memory-processing.

In an embodiment, the HMB module can include a Serializer/Deserializer (SerDes) interface coupled to the NMP module and the MSC module. The HMB is configured as a JEDEC-standards-compatible buffering device using the SerDes interface, which can be characterized by an energy cost of data transport below 5 pJ/bit. Also, the SerDes interface can be characterized by a 28 GT/s link in a 40 nm CMOS process.

In a specific embodiment, the hybrid memory system can include a front side and a back side and further comprising a voltage regulator and one or more SSD controllers configured on the backside; and wherein the HMB module and the plurality of first memory modules are configured on the front side and the plurality of second memory modules are configured on the back side. Those of ordinary skill in the art will recognize other variations, modifications, and alternatives.

In the following sections, we describe the logical implementation (programmer's view) of the Hybrid Memory Buffer, and the physical implementation of the hybrid memory module as enabled by the Hybrid Memory Buffer.

Figure 8:
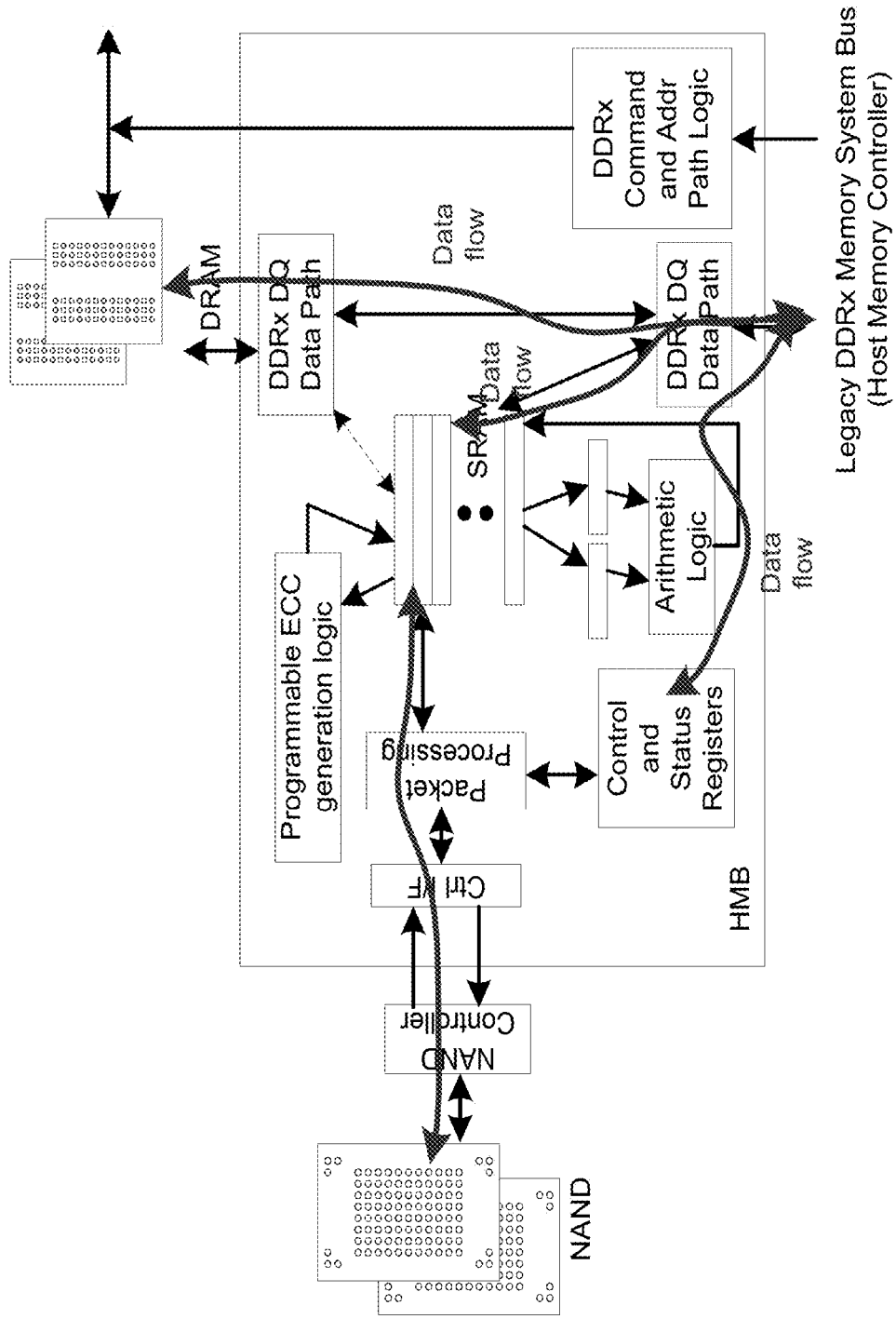
FIG. 8 shows the logical block diagram view of the HMB as well as the data flow paths from the host memory controller to the various regions of memory as presented by the HMB.

FIG. 8 shows the logical block diagram view of the HMB as well as the data flow paths from the host memory controller to the various regions of memory as presented by the HMB. FIG. 8 illustrates that the control and status registers as well as the SRAM buffers simply appear as part of the DRAM address space. The host memory controller therefore performs reads and writes into all regions of memory with the same DRAM access protocol, performing row activations, column reads or writes, and pre-charges rows as desired. In this manner, the addresses of the control and status registers and the SRAM buffers are mapped into the DRAM address space, and the HMB checks addresses of all requests to determine whether an access is to the DRAM devices, or to the control and status registers, or the SRAM buffers. Additionally, while the status and control registers are mapped into the DRAM address-space, that address-space must be non-cacheable so that status reads and updates can be performed without processor cache interference.

As illustrated this figure, the standard path of data retrieval from the NAND devices is to the SRAM buffers in the HMB. In one example usage mode, in order to load a page of data from the NAND memory sub-system, a privileged driver or kernel code specifies the Linear Block Address (LBA) of the NAND memory sub-system, and the index of the SRAM buffer that the data page from the NAND flash device is to be moved to by writing to the associated registers in the memory mapped control and status registers. Then, the privileged driver or kernel code also initiates the transfer by writing the appropriate registers in the control and status register address space of the HMB. Thereafter, as the data transfer proceeds from the NAND Flash device to the SRAM buffers, the HMB then provides updates to the status of the transfer in a given status register. In this manner, a privileged driver or kernel code initiates data movement from the NAND memory sub-system and attains status updates by simply performing reads and writes to the memory mapped control and status registers. In this usage model, the separate NAND controller device manages issues such as wear leveling and garbage collection for the HMB. In a separate usage model, the wear leveling and garbage collection logic may reside in the HMB, and the privileged driver or kernel code specifies the device ID, LUN, and physical block address to the HMB.

Upon completion of the data transfer from the NAND devices to the SRAM buffers as described, the data is ready for access by the host memory controller. Depending on the usage model, data present in the SRAM buffers may have to be moved into the DRAM sub-system before it can be used by the application that initiated the data request. For example, in one usage model of the hybrid memory system, the SRAM memory is utilized as buffer memory by the kernel or privileged driver. Therefore, before data can be accessed by the thread or process that initiated the request, it has to be moved into the memory address space of the thread—in the DRAM sub-system.

The movement of data from the SRAM buffers to the DRAM sub-system in the standards-compatible hybrid memory system is a non-trivial problem due to the fact that legacy memory controllers view the DRAM memory system as a simplistic slave sub-system. Therefore, the HMB cannot perform the SRAM-to-DRAM data transfer at-will, since the memory controller may initiate a DRAM memory access at any time. To effect the SRAM-to-DRAM data transfer, multiple data transfer mechanisms shall be designed into the HMB, and different mechanisms may be utilized for different systems and different application characteristics.

Figure 9:
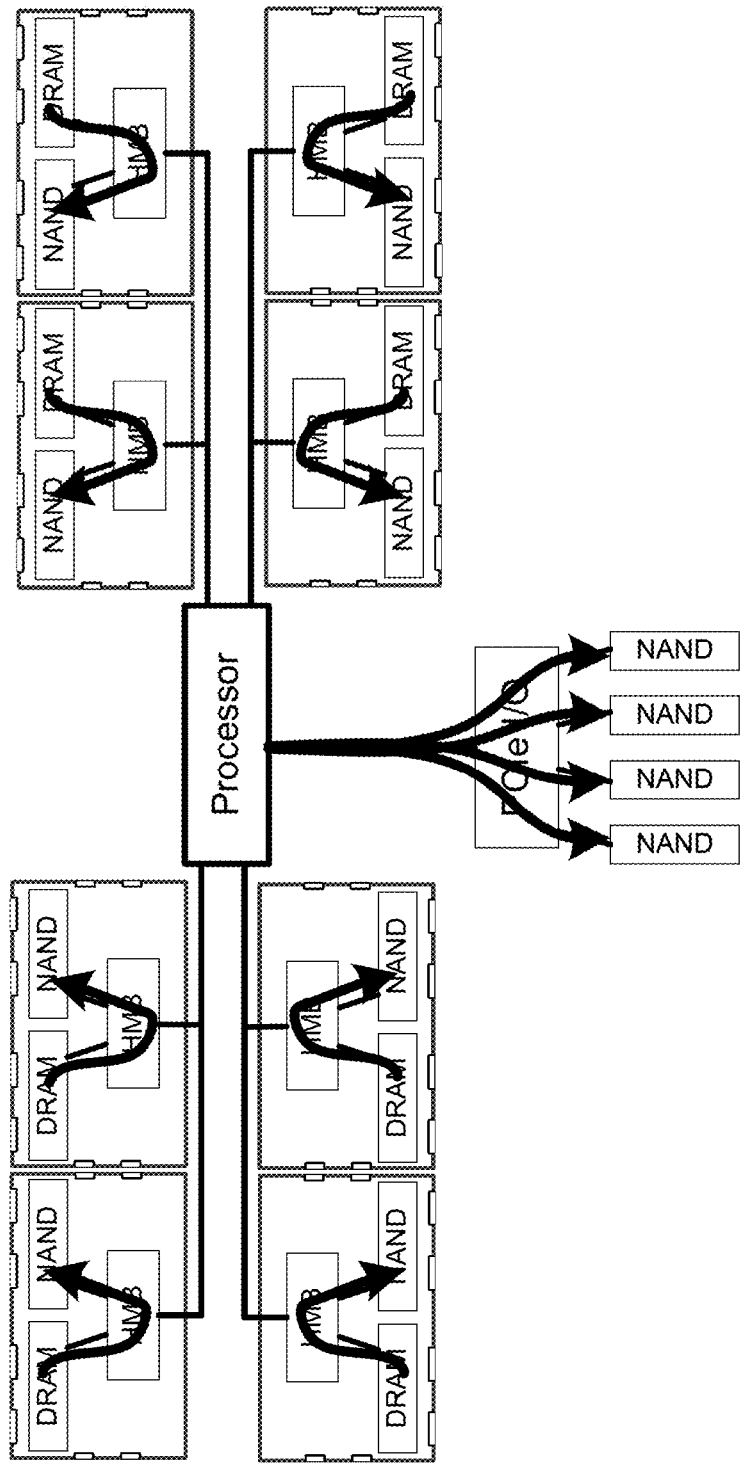
FIG. 9 illustrates isolation characteristics of the HMB enabling it to efficiently move data between the NAND Flash devices and DRAM devices residing on the hybrid memory module.

One usage model of the hybrid memory module is to enable memory check pointing. As illustrated in FIG. 9, the isolation characteristics of the HMB enable it to efficiently move data between the NAND Flash devices and DRAM devices residing on the hybrid memory module. That is, each hybrid memory module may initiate its own DRAM-to-NAND data transfer, and multiple modules on the same channel may initiate its own data DRAM-to-DATA transfer as needed. Additionally, the traditional I/O sub-system still exists to support additional I/O bandwidth for a large net increase in memory bandwidth to NAND Flash devices, thus reducing write-bandwidth dominated checkpoint operation.

The HMB enabled hybrid memory module is provided to operate in industry-standard servers that implement various RAS features to protect the data integrity of the memory systems. One common RAS feature utilized in all industry-standard servers is the Error Correcting Code, ECC, and for compatibility reasons, the HMB must seamlessly return ECC-correct data to the host memory controller for all read requests. That is, in the case that data is stored into the memory sub-system by the host memory controller, the host memory controller will provide the appropriate parity bits to protect the integrity of the data upon writes into the memory system. Thereafter, when data is retrieved from the memory sub-system, the memory controller will check the retrieved data against the retrieved ECC parity. In the case that the retrieved data differs from the expectation as defined by the retrieved ECC parity, an ECC protection fault will be signaled, and the "erroneous" data will likely cause the termination of the process that had accessed the data.

In the context of the HMB, the requirement of the ECC-correct data means that unless the HMB is capable of re-generating the ECC parity, then the ECC parity bits should be treated as data and stored along with the actual data when that data is to be placed into the NAND devices. Specifically, a 4 KB page in the SRAM buffers would necessarily appear as 4096 bytes of data and 512 bytes of ECC parity, and 4608 bytes of data would typically be moved to and from the NAND sub-system as to attain seamless compatibility with the operations of the standards-compatible, legacy DRAM memory system. The host controller attains understanding of the progress of data transfer by reading specific memory-mapped status registers in the HMB. The simple task of providing status return by the HMB is complicated by the fact that the HMB has no inherent understanding of the ECC algorithms used by the different memory controllers that may utilize the hybrid memory module.

There are multiple techniques that may be utilized to provide ECC-correct status words to the memory controller, but one simple technique that may be implemented is to require an initiation phase where the memory controller would program in a limited set of symbols that can be used by the HMB for the purpose of status return. In this manner, the memory controller in effect trains the HMB with a set of ECC-correct symbols that the HMB can use to return ECC-correct status symbols upon read requests to the status registers.

FIGS. 10A and 10B illustrate a front view and back view, respectively, of an implementation of a hybrid memory module enabled by the Hybrid Memory Buffer. In the example, the Hybrid DIMM is shown as a DDR3 Low Profile form factor memory module with standard module width of 133.35 mm and standard module height of 30.35 mm. FIG. 10A also shows that the front side of the hybrid memory module is populated with DDR3 SDRAM devices, and the reverse side of the hybrid memory module (in FIG. 10B) is populated with two channels of NAND devices with their respective SSD controller chips. Finally, FIGS. 10A and 10B also show that the Hybrid DIMM also contains integrated voltage regulation devices to provide proper voltage supply to the NAND devices and the SSD controllers from the common voltage supplied by standards-compatible systems to the DDR3 memory module.

FIGS. 10A and 10B illustrate an exemplary implementation of the hybrid memory module, and other implementations are possible, subject to the constraints of the DIMM form factor, the size of the DRAM devices, the NAND devices, the SSD controller chips, as well as the footprint of the voltage regulation devices. In the example shown in FIG. 10A/B, a hybrid memory module configuration of 16 GB of DDR3 SDRAM and 512 GB of MLC NAND is one configuration that may be enabled with memory devices. Additionally, as illustrated, 4 GB of DDR3 SDRAM and 800 GB of MLC NAND is another configuration that may be enabled with memory devices.

In an example, the core of the HMB contains a large SRAM buffer organized as multiple pages, where each page is 4 KB in size, or others. The width and placement of the SRAM buffers at a centralized location within the HMB provides natural enablement to an architectural capability of near-memory processing. That is, the HBM will be designed in a high performance ASIC process technology where the logic performance will be far superior to a memory-optimized process technology. In the following sections, we briefly outline the type of near-memory computation that may be performed in HMB, as well as outline the challenges inherent to the infrastructure-compatible implementation of the near-memory processing in industry-standard computing. In an example, we describe the issue of ECC-correct data return to the legacy memory controller and provide the solutions of storing the original ECC parity as data, as well as ECC-correct status-symbol training. However, in the case of near-memory processing, the data fields would be changed by the HMB and the HMB must contain the additional capability of ECC parity generation as illustrated. In the ideal case, specific ECC algorithms may be designed into the HMB as a hardware state machine, but in the case that the ECC algorithms are not know at design time, a software-based, programmable ECC-parity generation circuit may be included on die for general purpose re-construction of ECC parity (re)generation platforms.

One vector operation that may be performed by the HMB is one of page initialization where the entire 4 KB page may be initialized with 0x00, 0xFF, 0x55, or other patterns quickly and efficiently. The implementation of page-initialization in near-memory processing can greatly speed up common tasks such as memory initialization, page-clearing, or memory test operations.

A second vector operation that may be performed by the HMB may be a gather operation where sixteen 4 byte DWords (double words) or eight 8 byte QWords (quad words) may be gathered from multiple SRAM pages into a single 64 byte line. The HMB must then compute the ECC parity for the newly formed 64 byte, burst-length-of-eight cacheline, and the newly assembled cacheline can then be returned to the host memory controller. The gather operation can be used to reduce the energy and bandwidth cost of data movement where the actual data use is sparse relative to the size of the 64 byte cacheline.

A third vector operation that may be performed by the HMB may be the scatter operation that is the functional reversal to the gather operation. However, implementing the scatter operation in the HMB may be far more challenging than the gather operation in terms of compatibility with existing memory system architecture due to the fact that the scattering of each cache line will require the re-generation of ECC parity for each modified cacheline, which in turn requires multiple, semantically contiguous, read-modify-write cycles. Due to the challenging nature of the scatter operation, its implementation in the HMB is contingent upon the completion of the architectural study to resolve the ECC parity re-generation and multiple read-modify-write cycles issue.

In an example, the present techniques support hybrid memory, near-memory processing, utilizing energy-efficient, high speed SerDes technology to efficiently transport data between the memory components and the host processing elements. As illustrated, the Hybrid Memory Cube (HMC) memory access protocol to efficiently transport data in the memory system.

In an embodiment, the present invention includes a method for processing data in a hybrid memory system. This memory can include providing a hybrid memory system, which can include a processor; a hybrid memory buffer (HMB) module coupled to the processor, a plurality of a first memory modules coupled to the HMB module and a plurality of a second memory modules coupled to the HMB module, wherein the HMB comprises a Near-Memory-Processing (NMP) module, a memory storage controller (MSC) module coupled to the processor, and a Serializer/Deserializer (SerDes) interface coupled to the NMP module and the MSC module. The HMB is configured to monitor and manage wear leveling and garbage collection.

In a specific embodiment, the plurality of first memory modules can include RAM (Random Access Memory) modules, DRAM (Dynamic RAM) modules, or SDRAM (Synchronous DRAM), or the like. Also, the plurality of second memory modules comprises flash memory modules, NAND flash memory modules, vertical NAND flash memory modules, or NOR flash memory modules, or the like.

The method can include determining, by the processor, an address of a target data page from the plurality of second memory modules; determining, by the processor, an index of a target buffer destination in an SRAM buffer provided in the NMP module; initiating, by the processor, transfer of the target data page to the target buffer destination via writing to control and status registers provided in the MSC module; and updating, by the processor, a data status related to the target data page and the target buffer destination in the control and status registers using the HMB module.

In a specific embodiment, the plurality first memory modules and the plurality of second memory modules are configured as a plurality of hybrid memory modules having each of the first memory modules associated with one of the second memory modules. The method can include initiating, by the processor, a memory check pointing process wherein each of the plurality of hybrid memory modules is configured to move data from the first memory module to the second memory module independently using the HMB module.

The method can include configuring the HMB, by the processor, a set of ECC (Error Correcting Code) symbols associated with the data status; initiating, by the processor, a status return request to the HMB module; and returning, from the HMB module, a status return associated with the data status based on the set of ECC symbols. In a specific embodiment, the HMB is configured to provide ECC (Error Correcting Code) parity generation via a hardware state machine or via programmable ECC-parity generation circuit provided in the hybrid memory system.

An example memory operation can include comprising performing, by the HMB module, a page initialization process wherein a data page in the plurality of first or second memory modules is initialized to a predetermined data pattern using the NMP module.

Another memory operation example can include retrieving, by the HMB module, sixteen 4-byte data or eight 8-byte data from one or more data pages from the plurality of first or second memory modules; combining, by the HMB module, the sixteen 4-byte data or eight 8-byte data into a single 64-byte data; and determining, by the HMB module, an ECC (Error Correcting Code) parity for the single 64-byte data.

Yet another memory operation example can include retrieving, by the HMB module, a single 64-byte data from a data page from the plurality of first or second memory modules; performing, by the HMB module, a scatter process wherein the single 64-byte data is split into data segments comprising sixteen 4-byte data or eight 8-byte data; and determining, by the HMB module, an ECC (Error Correcting Code) parity for each of the data segments. Those of ordinary skill in the art will recognize other variations, modifications, and alternatives.

Figure 11:
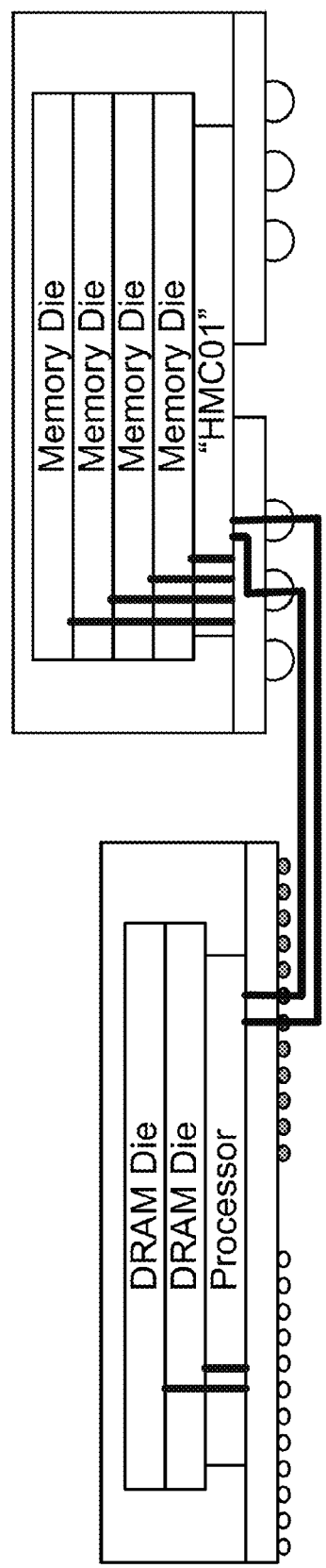
FIG. 11 shows an exemplary implementation of the stack interface device where the device is an interface device that support hybrid memory, near-memory processing, and utilizes energy-efficient, high speed SerDes technology to transport data between the memory components and the host processor.

FIG. 11 shows an exemplary implementation of the stack interface device where the device is an interface device that support hybrid memory, near-memory processing, and utilizes energy-efficient, high speed SerDes technology to transport data between the memory components and the host processor.

In an example, the present invention provides a hybrid memory system and related methods. In general, memory controller interfaces lack the following capabilities:
1. There is no explicit signaling mechanism to cause backpressure to memory transactions when the DIMM interface is busy. This capability or its equivalent becomes necessary to support variable latency devices such as NAND flash.
2. This is no explicit mechanism to cause an interrupt to the CPU from the memory controller interface. Again this capability or its equivalent becomes necessary to report completion of status for completion of events like DMA (direct memory access) between the DRAM device and the NAND flash device.

Figure 12:
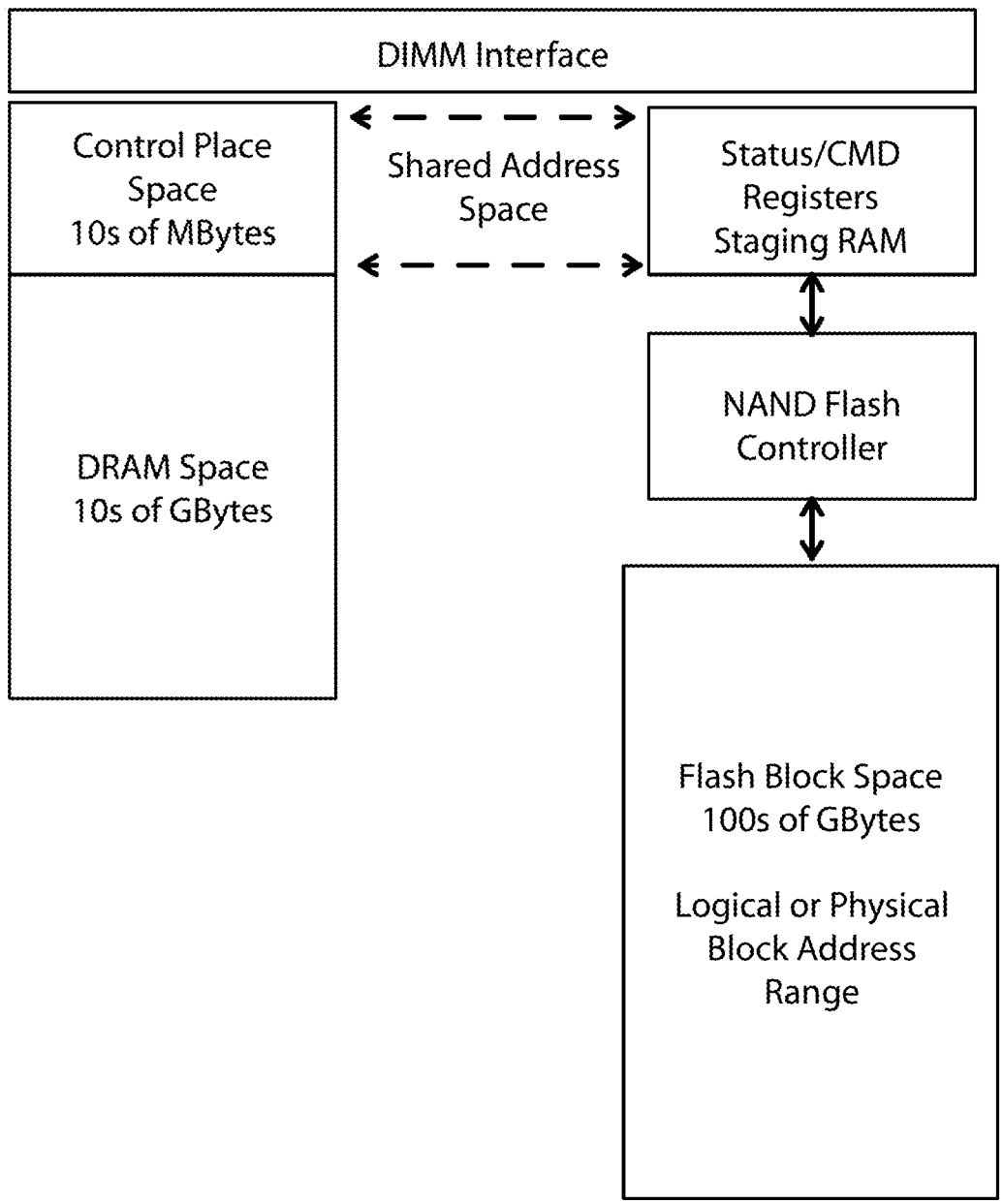
FIG. 12 is a simplified hardware architecture model for a hybrid DIMM according to an embodiment of the present invention.

FIG. 12 describes the key hardware architecture aspects of the Hybrid DIMM chipsets. In an example, a hybrid DIMM chipset apparatus is included. The apparatus has an interface bus, a control plane space operably communicating with the interface bus, and a DRAM space coupled to the control plane space. The apparatus has a register device operably communicating with the interface bus, a NAND Flash controller coupled to the register device, and a flash memory device space coupled to the NAND Flash controller. The control plane interface comprises a plurality of status and command registers, and an array of SRAM entries. The control plane interface is configured to execute a read command or a write command to initiate transfer of data to and from the DIMM interface using the plurality of SRAM entries in a caching process to perform the read command or the write command of the data into the flash memory device space such that an internal latency inherent with the flash memory devices is transparent to the DIMM interface. In an example, the internal latency inherent with the flash memory devices is on an order of about 30 microseconds to about 200 microseconds, while the DRAM device has a latency in the nanoseconds, which are much less than the flash memory devices.

In an alternative example, the present invention provides a method for operating a hybrid DIMM chipset apparatus. The method includes transferring data through a DIMM interface bus coupled to a control plane space operably. The DIMM interface bus is coupled to a plurality of DRAM devices and coupled to a plurality of flash memory devices. The method includes initiating a register device operably coupled with the interface bus and initiating a read command or a write command to transfer data to or from the interface device to initiate transfer of the data to and from the DIMM interface bus using a plurality of SRAM entries in a caching process to perform the read command or the write command of the data into the flash memory device space such that an internal latency inherent with the flash memory devices is transparent to the DIMM interface bus. That is, data transferred between the DIMM interface bus and flash traverse through the plurality of SRAM devices for caching purposes such that the DIMM interface bus and/or host computer communicates using a DRAM protocol and is transparent to the host computer.

Upon system boot, the BIOS (basic input output system) discovers the hardware architecture of the Hybrid DIMM chipset and reports several attributes to the kernel system software with well-defined properties of the Hybrid DIMM module. (In Intel x86 systems the BIOS reporting structure to the kernel is the APIC Table structure) These are described below:
1. The DRAM memory region is presented in this data structure comprising a control plane space (in 10 s of megabytes) and a regular DRAM memory spaces (in 10 s of gigabytes).
2. The DRAM memory region is cacheable and can optionally be made visible to the applications by the system software.
3. The control-plane space is non-cacheable and is carved out to address status/command registers and a SRAM (static random access memory) region in the Hybrid DIMM chipset.
4. A Hybrid DIMM specific software driver accesses this control plane space to initiate various actions. Some of these actions comprise: starting DMA transaction between the NAND flash and DRAM memory, writing command registers to activate these transactions, and reading status registers to determine completion information. The control-plane interface needs to be non-cacheable because the driver needs to read accurate status from the Hybrid DIMM chipset and not a stale status from the CPU cache (if this space is made cacheable).
5. This apparatus of status/command registers and the SRAM in the control-plane space allows the Hybrid DIMM driver software to create actions using normal memory read/write transactions through the memory controller interface. Note that reporting capability is realized by scheduled polling of the status register by the driver software and as such no memory controller change is required.
6. The NAND flash controller has visibility to this command and SRAM region and can take note of various actions requested by the Hybrid DIMM driver software.
7. The NAND flash device attributes like logical/physical block address range, bad blocks, error correction and endurance information can all be reported either in the APIC data structure accessible by the kernel or can be reported in the SRAM region of the chipset.

This hardware abstraction model allows different software use case models for the system designers for different applications. Some of these are enumerated below:

DDR4 NVDIMM:
a. Only DRAM Memory Space Visible to Applications
b. AND Flash Used By System Software as Persistent Memory
   i. For Power Fail & Checkpoint Recovery DIMM NAND SSD with DRAM Cache:
a. NAND Flash Appears as Direct Attached Storage
   i. Need Storage Driver & File System Software
b. DRAM optionally used as Cache
   i. Invisible to Applications and Not Part of DRAM Address Space DRAM Memory and NAND as Fast Swap:
a. DRAM Memory Space Visible to Applications
b. NAND Flash Mapped as Fast Swap SSD Drive
   i. Exploits On-DIMM DRAM Memory & Flash Affinity DRAM Memory and Raw Flash Block Storage:
a. Closest to the HW Abstraction Model
b. DRAM Memory & Flash Memory Reported to the System
c. NAND Flash Physical Block Addresses are Exposed
   i. System Firmware to do Wear-Leveling and Bad Block Management
d. System Software has Flexibility to build Different SW Use Case Models In various embodiments, a memory buffer as described herein could be implemented as a single integrated circuit (IC), or with a multiple chip chipset with various functions spread among several ICs. For example, a memory system based on the DDR4 standard employs DIMMs which include nine separate data buffer chips arranged close to the connector contacts and provides an interface between the connector and the DRAMs. The standard also provides for a central control element which functions as the register section of the DIMM and includes an extra interface to control the data buffers. For this type of chipset implementation, implementing an auxiliary port as described herein requires a new path from the data buffers to the central controller.

The embodiments shown in the figures and described above are merely exemplary. The present system encompasses any memory system which employs a memory buffer that serves as an interface between the individual memory chips on a DIMM and a host, and which includes at least one additional, auxiliary interface which enables the memory buffer to serve as an interface between the host and/or memory chips and additional external devices.

In other embodiments, a system may include more than one host computer (each with host controller) wherein each host computer includes a memory buffer having a RAM interface and an auxiliary interface, as described herein. The auxiliary interfaces of the memory buffer of one host computer may be directly coupled to an auxiliary interface of the memory buffer of another host computer, or may be coupled via one or more switches. As described herein, such configurations enable the transfer of data from one RAM to another RAM bypassing data paths of the host controllers.

Various example embodiments as described with reference to the accompanying drawings, in which embodiments have been shown. This inventive concept may, however, be embodied in many different forms and should not be construed as limited to the embodiments set forth herein. Rather, these embodiments are provided so that this disclosure is thorough and complete, and has fully conveyed the scope of the inventive concept to those skilled in the art. Like reference numerals refer to like elements throughout this application.

It has been understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It has be understood that when an element is referred to as being "connected" or "coupled" to another element, it can be directly connected or coupled to the other element or intervening elements may be present. In contrast, when an element is referred to as being "directly connected" or "directly coupled" to another element, there may be no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It has been be further understood that terms, such as those defined in commonly used dictionaries, should be interpreted as having a meaning that is consistent with their meaning in the context of the relevant art and will not be interpreted in an idealized or overly formal sense unless expressly so defined herein.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for processing data in a hybrid memory system, the method comprising:
   providing a hybrid memory system comprising:
      a processor; a hybrid memory buffer (HMB) module coupled to the processor, a plurality of a first memory modules coupled to the HMB module and a plurality of a second memory modules coupled to the HMB module, wherein the HMB comprises a Near-Memory-Processing (NMP) module, a memory storage controller (MSC) module coupled to the processor, and a Serializer/Deserializer (SerDes) interface coupled to the NMP module and the MSC module;
   determining, by the processor, an address of a target data page from the plurality of second memory modules;
   determining, by the processor, an index of a target buffer destination in an SRAM buffer provided in the NMP module;
   initiating, by the processor, transfer of the target data page to the target buffer destination via writing to control and status registers provided in the MSC module; and
   updating, by the processor, a data status related to the target data page and the target buffer destination in the control and status registers using the HMB module;
   retrieving, by the HMB module, sixteen 4-byte data or eight 8-byte data from one or more data pages from the plurality of first or second memory modules;
   combining, by the HMB module, the sixteen 4-byte data or eight 8-byte data into a single 64-byte data; and
   determining, by the HMB module, an ECC (Error Correcting Code) parity for the single 64-byte data.

2. The method of claim 1 wherein the plurality of first memory modules comprises RAM (Random Access Memory) modules, DRAM (Dynamic RAM) modules, or SDRAM (Synchronous DRAM).

3. The method of claim 1 wherein the plurality of second memory modules comprises flash memory modules, NAND flash memory modules, vertical NAND flash memory modules, or NOR flash memory modules.

4. The method of claim 1 wherein the HMB is configured to monitor and manage wear leveling and garbage collection.

5. The method of claim 1 wherein the plurality first memory modules and the plurality of second memory modules are configured as a plurality of hybrid memory modules having each of the first memory modules associated with one of the second memory modules, and further comprising
   initiating, by the processor, a memory check pointing process wherein each of the plurality of hybrid memory modules is configured to move data from the first memory module to the second memory module independently using the HMB module.

6. The method of claim 1 further comprising
   configuring the HMB, by the processor, a set of ECC (Error Correcting Code) symbols associated with the data status;
   initiating, by the processor, a status return request to the HMB module; and
   returning, from the HMB module, a status return associated with the data status based on the set of ECC symbols.

7. The method of claim 1 wherein the HMB is configured to provide ECC (Error Correcting Code) parity generation via a hardware state machine or via programmable ECC-parity generation circuit provided in the hybrid memory system.

8. The method of claim 1 further comprising performing, by the HMB module, a page initialization process wherein a data page in the plurality of first or second memory modules is initialized to a predetermined data pattern using the NMP module.

9. A method for processing data in a hybrid memory system, the method comprising:
   providing a hybrid memory system comprising:
      a processor; a hybrid memory buffer (HMB) module coupled to the processor, a plurality of a first memory modules coupled to the HMB module and a plurality of a second memory modules coupled to the HMB module, wherein the HMB comprises a Near-Memory-Processing (NMP) module, a memory storage controller (MSC) module coupled to the processor, and a Serializer/Deserializer (SerDes) interface coupled to the NMP module and the MSC module;
   determining, by the processor, an address of a target data page from the plurality of second memory modules;
   determining, by the processor, an index of a target buffer destination in an SRAM buffer provided in the NMP module;
   initiating, by the processor, transfer of the target data page to the target buffer destination via writing to control and status registers provided in the MSC module;
   updating, by the processor, a data status related to the target data page and the target buffer destination in the control and status registers using the HMB module;
   retrieving, by the HMB module, sixteen 4-byte data or eight 8-byte data from one or more data pages from the plurality of first or second memory modules;
   combining, by the HMB module, the sixteen 4-byte data or eight 8-byte data into a single 64-byte data;
   determining, by the HMB module, an ECC (Error Correcting Code) parity for the single 64-byte data;
   retrieving, by the HMB module, a single 64-byte data from a data page from the plurality of first or second memory modules;
   performing, by the HMB module, a scatter process wherein the single 64-byte data is split into data segments comprising sixteen 4-byte data or eight 8-byte data; and
   determining, by the HMB module, an ECC (Error Correcting Code) parity for each of the data segments.

10. The method of claim 9 wherein the plurality of first memory modules comprises RAM (Random Access Memory) modules, DRAM (Dynamic RAM) modules, or SDRAM (Synchronous DRAM).

11. The method of claim 9 wherein the plurality of second memory modules comprises flash memory modules, NAND flash memory modules, vertical NAND flash memory modules, or NOR flash memory modules.

12. The method of claim 9 wherein the HMB is configured to monitor and manage wear leveling and garbage collection.

13. The method of claim 9 wherein the plurality first memory modules and the plurality of second memory modules are configured as a plurality of hybrid memory modules having each of the first memory modules associated with one of the second memory modules, and further comprising
   initiating, by the processor, a memory check pointing process wherein each of the plurality of hybrid memory modules is configured to move data from the first memory module to the second memory module independently using the HMB module.

14. The method of claim 9 further comprising
   configuring the HMB, by the processor, a set of ECC (Error Correcting Code) symbols associated with the data status;
   initiating, by the processor, a status return request to the HMB module; and returning, from the HMB module, a status return associated with the data status based on the set of ECC symbols.

15. The method of claim 9 wherein the HMB is configured to provide ECC (Error Correcting Code) parity generation via a hardware state machine or via programmable ECC-parity generation circuit provided in the hybrid memory system.

16. The method of claim 9 further comprising performing, by the HMB module, a page initialization process wherein a data page in the plurality of first or second memory modules is initialized to a predetermined data pattern using the NMP module.

\* \* \* \* \*